United States Patent
Crafts et al.

(10) Patent No.: US 9,508,887 B2
(45) Date of Patent: Nov. 29, 2016

(54) METHODS OF FORMING SOLAR CELLS

(71) Applicant: TETRASUN, INC., San Jose, CA (US)

(72) Inventors: Douglas E. Crafts, Los Gatos, CA (US); Oliver Schultz-Wittmann, Sunnyvale, CA (US); Adrian B. Turner, Palo Alto, CA (US); Qin Yang Ong, San Leandro, CA (US)

(73) Assignee: TETRASUN, INC., San Jose, CA (US)

( * ) Notice: Subject to any disclaimer, the term of this patent is extended or adjusted under 35 U.S.C. 154(b) by 0 days.

(21) Appl. No.: 14/437,608

(22) PCT Filed: Oct. 24, 2013

(86) PCT No.: PCT/US2013/066532
§ 371 (c)(1),
(2) Date: Apr. 22, 2015

(87) PCT Pub. No.: WO2014/066588
PCT Pub. Date: May 1, 2014

(65) Prior Publication Data
US 2015/0295122 A1    Oct. 15, 2015

Related U.S. Application Data

(60) Provisional application No. 61/718,489, filed on Oct. 25, 2012.

(51) Int. Cl.
*H01L 31/18* (2006.01)
*H01L 31/0216* (2014.01)
(Continued)

(52) U.S. Cl.
CPC ......... *H01L 31/18* (2013.01); *H01L 31/02008* (2013.01); *H01L 31/02168* (2013.01); *H01L 31/02363* (2013.01); *H01L 31/022425* (2013.01); *Y02E 10/50* (2013.01)

(58) Field of Classification Search
CPC ................................................ H01L 31/02008
See application file for complete search history.

(56) References Cited

U.S. PATENT DOCUMENTS

| 4,451,554 A * | 5/1984 | Kishi ..................... H01L 21/306 216/103 |
| 7,429,446 B2 * | 9/2008 | Sawada ..................... G03F 7/40 430/311 |

(Continued)

FOREIGN PATENT DOCUMENTS

| EP | 2 290 705 A2 | 3/2011 |
| JP | 2010147102 A | 7/2010 |
| KR | 101161095 B1 | 6/2012 |

OTHER PUBLICATIONS

International Search Report for PCT/US2013/066532 dated Mar. 10, 2014.
(Continued)

*Primary Examiner* — Mohammad Islam
*Assistant Examiner* — Ankush Singal
(74) *Attorney, Agent, or Firm* — Kevin P. Radigan, Esq.; Heslin Rothenberg Farley & Mesiti P.C.

(57) ABSTRACT

Methods of fabricating conductive patterns over a solar cell structure are provided, in which a patterned resist layer is provided over an anti-reflective coating layer formed over a solar cell structure. The patterned resist layer is used to etch the exposed portion of the anti-reflective coating, and a metal seed layer is provided over the resist layer and the exposed portion of the solar cell structure's surface. The metal seed layer is selectively removed from over the patterned resist layer without removal from the exposed portion of the surface of the solar cell structure. Different thermal conductivities of the patterned resist layer and the solar cell structure's surface facilitate the selective removal of the seed layer from over the resist layer. Also provided are methods of facilitating simultaneous fabrication of conductive patterns over a plurality of solar cell structures using one or more frame structures.

21 Claims, 14 Drawing Sheets

(51) Int. Cl.
  *H01L 31/0224*  (2006.01)
  *H01L 31/02*  (2006.01)
  *H01L 31/0236*  (2006.01)

(56) References Cited

U.S. PATENT DOCUMENTS

| | | | |
|---|---|---|---|
| 7,521,000 B2 * | 4/2009 | Chandrachood | C03C 17/06 216/67 |
| 7,547,569 B2 * | 6/2009 | Weidman | H01L 31/022425 438/102 |
| 8,133,775 B2 * | 3/2012 | Makiyama | H01L 21/0274 257/E21.025 |
| 2005/0008945 A1 * | 1/2005 | Brooks | C23F 4/00 430/5 |
| 2009/0139568 A1 * | 6/2009 | Weidman | H01L 31/022425 136/256 |
| 2010/0055901 A1 | 3/2010 | Zhang et al. | |
| 2010/0190290 A1 * | 7/2010 | Rana | H01L 31/022425 438/98 |
| 2010/0193016 A1 * | 8/2010 | Fernandez | H01L 31/022425 136/255 |
| 2010/0279454 A1 | 11/2010 | Eickelmann et al. | |
| 2011/0076847 A1 | 3/2011 | Aqui et al. | |
| 2011/0132443 A1 * | 6/2011 | Schultz-Wittman | H01L 31/02168 136/252 |
| 2011/0140226 A1 | 6/2011 | Jin et al. | |
| 2011/0240997 A1 | 10/2011 | Rockenberger et al. | |
| 2011/0284983 A1 * | 11/2011 | Wu | H01L 31/022425 257/434 |
| 2014/0273504 A1 * | 9/2014 | Nainani | H01L 21/02277 438/758 |

OTHER PUBLICATIONS

Crafts et al., Extended European Search Report for EP Application No. 13848914.1, dated May 11, 2016 (7 pages).

* cited by examiner

METHODS OF FORMING SOLAR CELLS

CROSS-REFERENCE TO RELATED APPLICATION

This application claims the benefit of U.S. provisional patent application Ser. No. 61/718,489, filed Oct. 25, 2012, which is hereby incorporated herein by reference in its entirety.

FIELD OF THE INVENTION

The present invention relates generally to methods of fabricating solar cells, and more particularly, to methods of fabricating conductive patterns for solar cell structures.

BACKGROUND

Solar cells provide widespread benefits to society by converting solar energy into useable electrical power. Demand for higher efficiency solar cells continues to motivate development of new methods of manufacturing solar cells.

In a typical solar cell, solar radiation illuminates one surface of a solar cell, usually referred to as the front side or the sunny side. In many solar cells, a reflective layer is provided over the back side to improve internal light entrapment. One factor that may affect the efficiency of a solar cell is shading of the front surface by adjacent fixtures or by portions of the solar cell, such as shading from metal electrodes. In general, an optimized metal electrode grid of a solar cell requires balancing losses between shading of the solar cell surface by the electrodes and the electrical resistance of the metal structure. Optimizing the efficiency of the solar cell generally requires forming a metal electrode with a pattern of narrow electrically conductive "fingers" with short distances therebetween.

Current solar cell production methods may use varying methods for forming the metal structures and electrodes. For example, a silver paste may be printed over an anti-reflective coating layer, such as a silicon nitride coating, formed on a surface of a solar cell structure, and then fired through the anti-reflective coating in a high-temperature process. However, such processes may result in conductive patterns with a relatively wide metal finger having a width in excess of 50 µm (typically about 80 µm). The processes may also result in lower conductivity of the metal grid pattern due to the use of several non-metallic components in the silver paste. The firing processes may also result in a penetration of the metal paste components through the anti-reflective layer into the substrate of the solar cell structure, whereby increased recombination may occur. This may undesirably affect the p-n junction in front-junction solar cell devices, or may reduce the collection efficiency of back-junction solar cell devices.

One possible method of forming metal structures and electrodes is depicted in FIGS. 1A-1D. FIG. 1A depicts the beginning of the process, which includes using photo-sensitive resist layers 130 deposited over an anti-reflective coating layer 120 over a solar cell structure 110. In FIG. 1B, the resist layer 130 is partially exposed to ultra-violet light to form the desired pattern, followed by etching a portion of the anti-reflective coating 120 through the exposed portions of the resist layer 130, usually with an acid solution. Ideally, this etching process forms negatively inclined flanks 140 in the photo-resist layer 120, and exposes a portion of the surface of the solar cell structure 110. In FIG. 1C, a thin metal film 150 may be deposited, generally by evaporation or sputtering, over the surface of the photo-resist layer 130 and the exposed surface of the solar cell structure 110. The negative inclined flanks 140 ensure that the metal film 150 formed over the surface of the solar cell structure 110 is not in contact with the metal film 150 formed over photo-resist layer 130. This permits a lift-off step, in which the photo-resist layer 130, through the uncovered sides of the negative flanks 140, is exposed to a caustic substance 160 that dissolves the resist layer 130. This results in the metal film 150 formed over the photo-resist layer 130 being removed therewith, as best shown in FIG. 1D. Once the metal film 150 formed over the photo-resist layer 130 is removed, only the conductive metal contact 150 over the surface of the solar cell structure 110 remains.

This method generally depends on the formation of the negatively-inclined flanks 140 of the photo-resist layer 130. In some cases, as shown in FIG. 1E, non-ideal vertical flanks 170 may be formed, or, as shown in FIG. 1F, non-ideal positively-inclined flanks 180. These cases result in a continuous metal film layer 150 being formed over the photo-resist layer 130 and the exposed portion of the solar cell structure 110 (as depicted in FIG. 1G for the vertical flanks 170 and FIG. 1H for the positively-inclined flanks 180). Continuous metal film layers 150 make it difficult to uniformly begin the stripping process of the photo-resist layer 130 from the exposed portions of the flanks, as was the case for the negatively-inclined flanks 140. When there is a vertical flank 170 or a positively-inclined flank the metal film 150 prevents the caustic substance from contacting the photo-resist layer 130. This may have undesirable effects on the metal film layer 150 which may increase the processing time for the lift-off process.

SUMMARY OF THE INVENTION

The shortcomings of the prior art are overcome and additional advantages are provided through the provision, in one aspect, of a method for fabricating a solar cell structure, which includes: providing a solar cell structure having an anti-reflective coating layer thereon; forming a patterned resist layer over the anti-reflective coating layer of the solar cell structure; etching away an exposed portion of the anti-reflective coating layer using the patterned resist layer to expose a portion of a surface of the solar cell structure; forming a metal seed layer over the solar cell structure, the metal seed layer having a first portion extending over the patterned resist layer, and a second portion extending over the exposed portion of the surface of the solar cell structure; and selectively removing the first portion of the metal seed layer, and the patterned resist layer.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. The solar cell and processes described herein describe deposition and removal of materials described as layers. It is understood that each layer can cover all or a portion of the solar cell and/or all or a portion of a layer or a substrate underlying the layer. For example, a "layer" can include any amount of any material that contacts all or a portion of a surface.

Reference is made below to the drawings, which are not drawn to scale for ease of understanding, wherein the same reference numbers used throughout different figures designate the same or similar components.

Figure 1A:
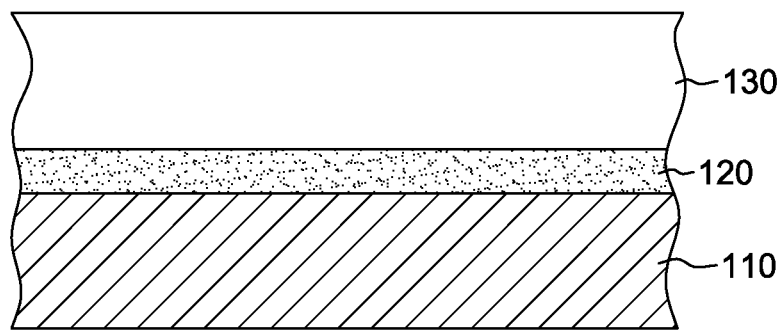
FIGS. 1A-1H depict, in part, one or more methods of "metal lift-off" used in fabrication of known solar cell structures.
Figure 1B:
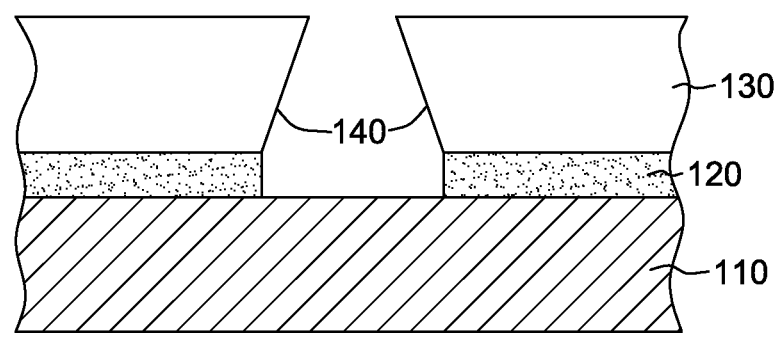
Figure 1C:
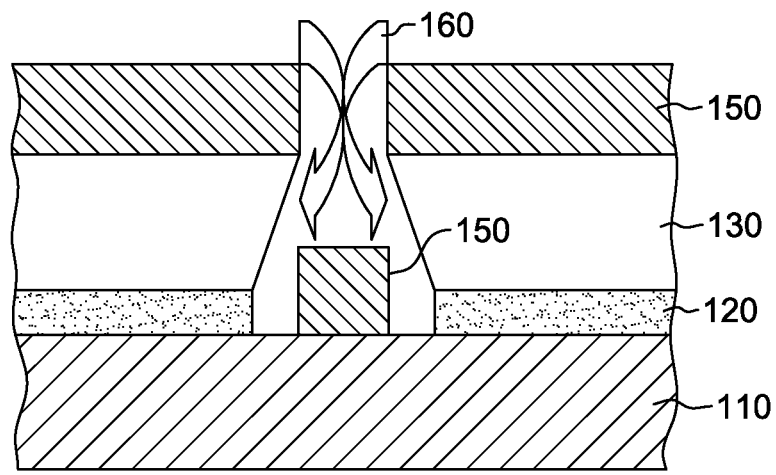
Figure 1D:
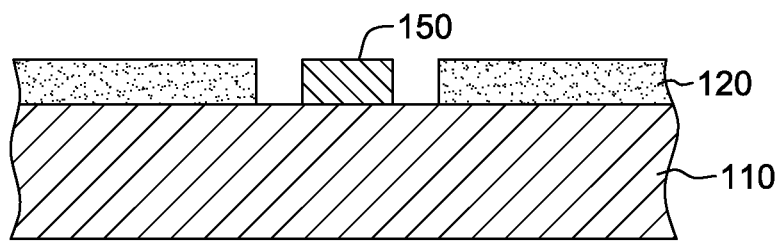
Figure 1E:
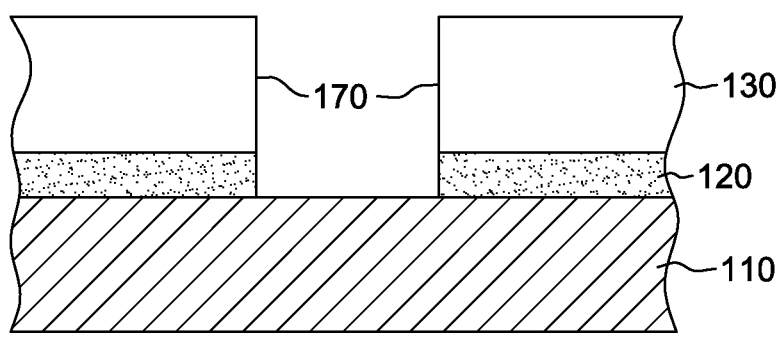
Figure 1F:
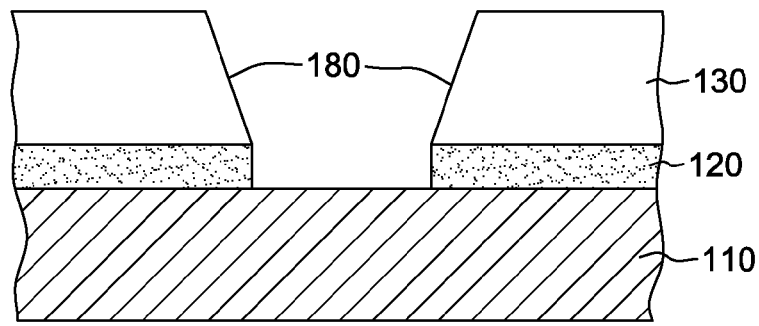
Figure 1G:
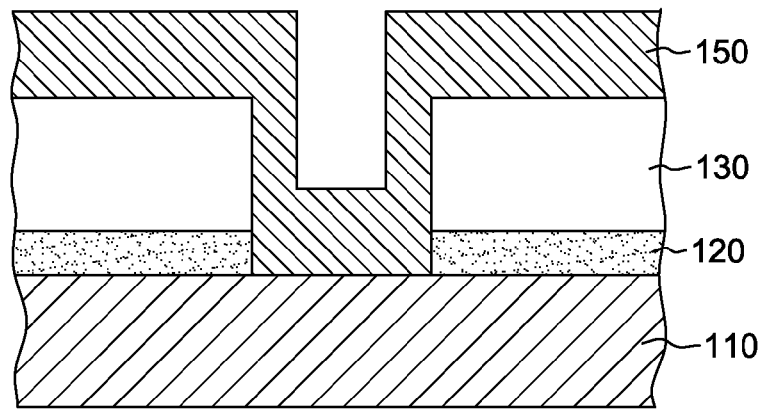
Figure 1H:
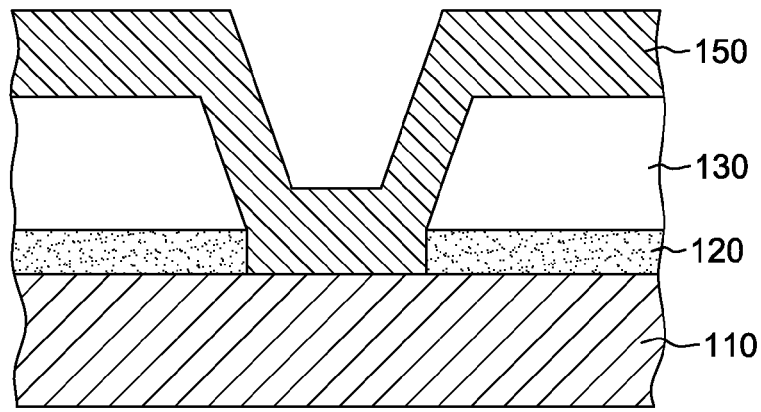
Figure 2A:
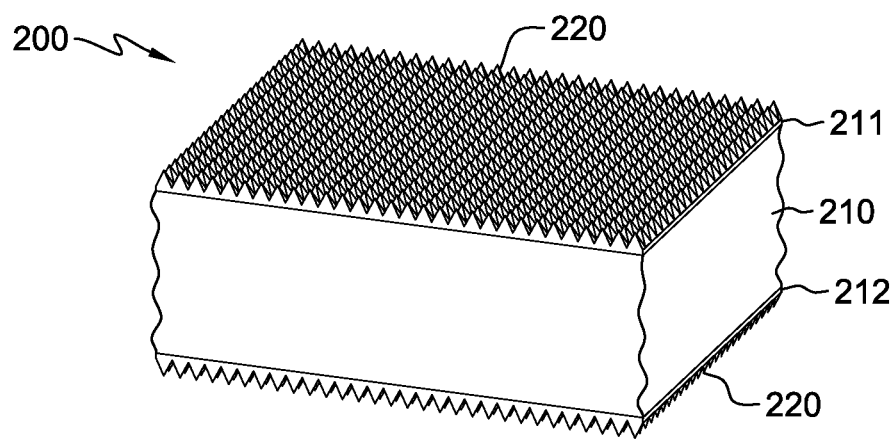
FIG. 2A depicts one embodiment of a solar cell structure provided with an anti-reflective coating layer formed on a front and a back surface thereof, according to one or more aspects of the present invention.

FIG. 2A depicts an embodiment of a solar cell structure 200, to be processed in accordance with one or more aspects of the present invention. The solar cell structure has a substrate 210, a first, front surface 211, and an anti-reflective coating 220 formed over the front surface 211. In this embodiment, solar cell structure 200 includes a second, back surface 212 over an opposite side of the structure, also with an anti-reflective coating 220 over the back surface 212. The methods disclosed herein allow (in one aspect) for processing of multiple surfaces of a solar cell structure at the same time, in which one or more processing steps applied to one surface may be applied to the other surface as well, for instance, to facilitate manufacturing efficiency. Note, however, that the methods disclosed may alternatively be applied to just one surface of the solar cell structure(s) 200, as desired.

By way of example, the anti-reflective coatings 220 may be, for example, silicon nitride, but may generally be any material that has anti-reflective properties. The surfaces 211, 212 of the solar cell structure, with anti-reflective coatings 220 over those surfaces, are depicted with a pyramid-like crystalline structure. The surface structures depicted is for illustrative purposes only. It should be understood that the disclosed methods may apply layers over surfaces of a solar cell structure 200 with surfaces 211, 212 having any shape, texture, or crystalline surface structure.

Figure 2B:
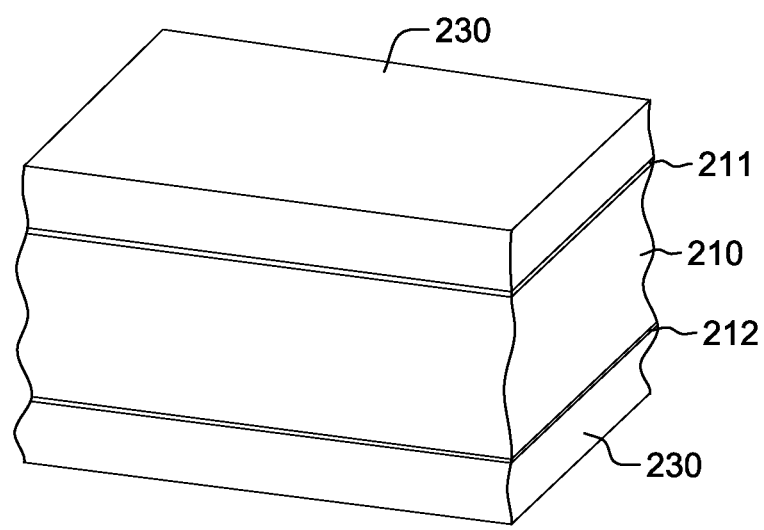
FIG. 2B depicts the solar cell structure of FIG. 2A, with a resist layer provided formed on the anti-reflective coating layers, according to one or more aspects of the present invention.

FIG. 2B depicts the solar cell structure 200 of FIG. 2A, after a resist layer 230 has been applied over the anti-reflective coating layers 220 of each of the surfaces 211, 212. The resist layers 230 may typically be a dry film resist material, such as a photo-sensitive polymer, in which a pattern may be formed, such as through a photo-lithographic process. The resist layers 230 may be applied over the entire solar cell structure 200, with a pattern formed subsequently in the resist layer, although the patterned resist layer may potentially be provided over the solar cell structure 200 by other means. The resist layer 230 has a thermal conductivity lower than a thermal conductivity of the surfaces 211, 212 of the solar cell structure 200. The difference in the thermal conductivities may advantageously facilitate selective removal of a metal seed layer (not shown in FIG. 2B) in subsequent processes, as disclosed herein.

Figure 2C:
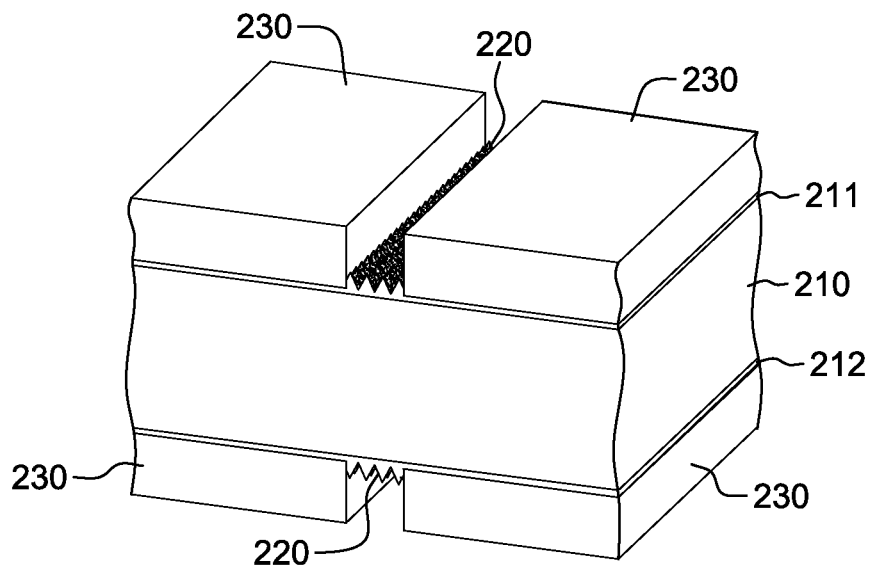
FIG. 2C depicts the solar cell structure of FIGS. 2A and 2B, with a portion of a desired pattern formed in the resist layer for facilitating the formation of a conductive pattern, and exposing a portion of the anti-reflective coating layer, according to one or more aspects of the present invention.

FIG. 2C depicts the solar cell structure 200 of FIG. 2B with a portion of a pattern formed in the resist layers 230 exposing a portion of the anti-reflective coating layer 220 formed over the surfaces 211, 212 of the solar cell structure 200. The pattern may be any desired pattern; for instance, the pattern may correspond to a desired pattern of narrow conductive grid "fingers" or channels. One process for forming the pattern makes use of the properties of the anti-reflective coating layers 220 beneath the resist layers 230, wherein collimated light or laser tools may be used to form narrow lines or channels in the resist layers 230, with the anti-reflective coating layer 220 minimizing the reflection of the light. This may enable patterning channels with widths of about 50 micrometers or less, potentially as narrow as about 15 micrometers or less, according to the particular design of the solar cell structure 200. This process may thus facilitate achieving a desired feature of high-efficiency solar cells, namely, formation of metal electrodes with widths of about 50 micrometers or less and down to about 15 micrometers or less, as desired.

Figure 2D:
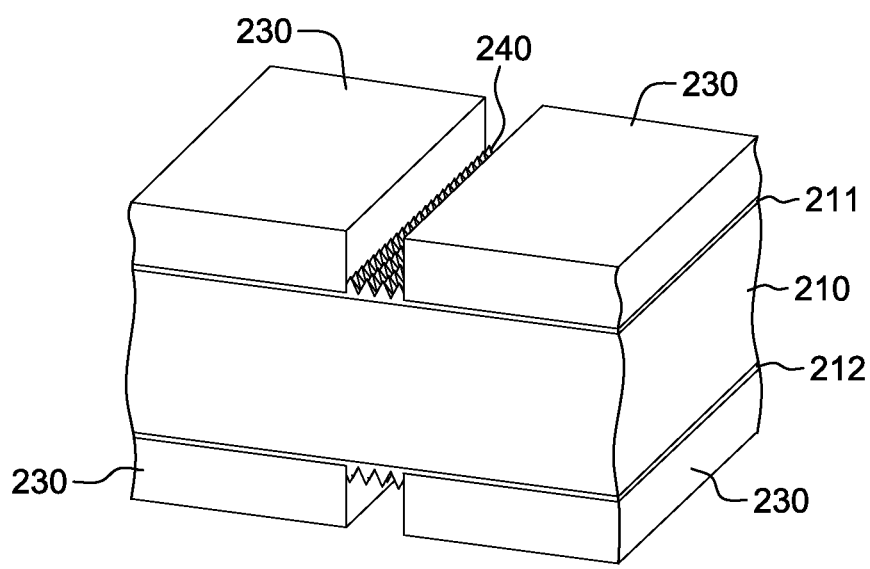
FIG. 2D depicts the solar cell structure of FIGS. 2A-2C, with the exposed portion of the anti-reflective coating layer removed via an etching process, exposing a portion of the surface of the solar cell structure, according to one or more aspects of the present invention.

FIG. 2D depicts the solar cell structure 200 of FIG. 2C, with the exposed portion of the anti-reflective coating layer etched away, exposing a portion 240 of each of the surfaces 211, 212 of the solar cell structure 200. The anti-reflective coating layer may be etched away by any process that safely lifts off the anti-reflective coating without penetrating below the surfaces 211, 212 of the solar cell structure 200. For example, if the anti-reflective coating is a dielectric film, such as silicon nitride, the coating may be etched away by commonly used in-line etch tools. The remaining patterned resist layer 230 protects the other portions of the solar cell structure 200 and the anti-reflective coating layer beneath the resist layer 230 during this etching process.

Figure 2E:
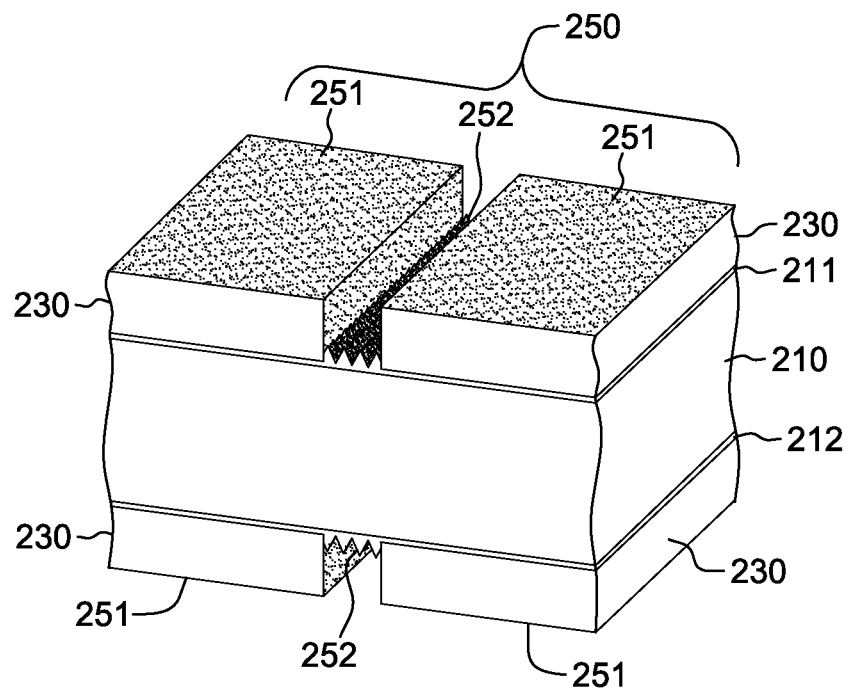
FIG. 2E depicts the solar cell structure of FIGS. 2A-2D after a metal seed layer has been formed on the solar cell structure, with a first portion of the metal seed layer being formed on the patterned resist layer and a second portion of the metal seed layer being formed on the exposed portion of the surface of the solar cell structure, according to one or more aspects of the present invention.

FIG. 2E depicts the solar cell structure 200 of FIG. 2D, with a metal seed layer 250 provided over the solar cell structure. In one example, metal seed layer 250 may be deposited with first portions 251 disposed over the resist layers 230, and second portions 252 formed over the exposed portion of each of the surfaces 211, 212 of the solar cell structure 200. The metal seed layer 250 may overlie the front and back surfaces 211, 212 as shown, and may be any desired conductive material, such as metals. The seed layer 250 may be provided by any appropriate method, such as via sputtering tools or physical vapor deposition (PVD); however, other methods may similarly form the metal seed layers 250 over the resist layers 230 and exposed portions of the solar cell structure surface 200. The metal seed layer 250 need not necessarily cover the entire resist layer 230, but it should cover the exposed portions of the surfaces 211, 212 of the solar cell structure(s) 200, as this facilitates electroplating material over those portions to form the desired conductors or electrodes of the solar cell structure(s).

Figure 3A:
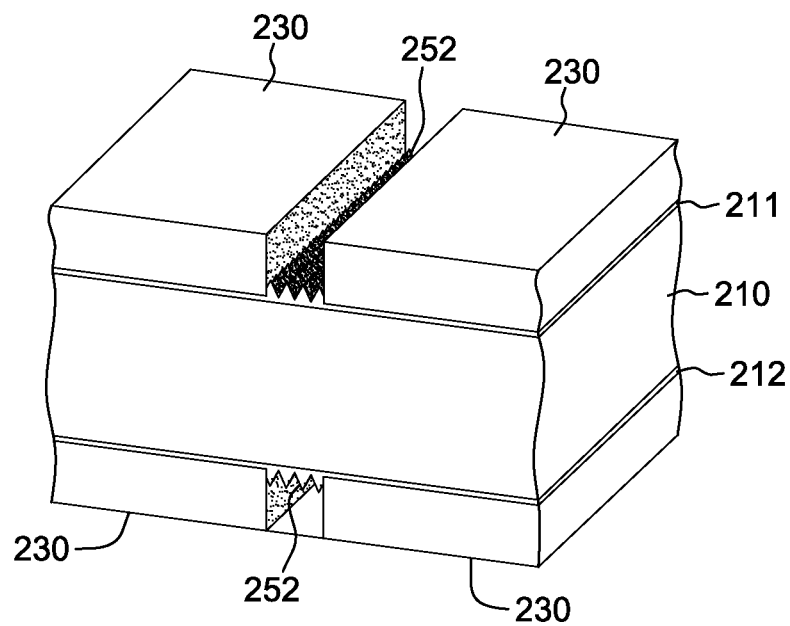
FIGS. 3A-3C depict one example of a process for selective removal of the first portion of the metal seed layer and for forming metal electrodes, in which the first portion of the metal seed layer is removed, the patterned resist layer is removed, and a conductive material is electroplated over the second portion of the metal seed layer, according to one or more aspects of the present invention.
Figure 3B:
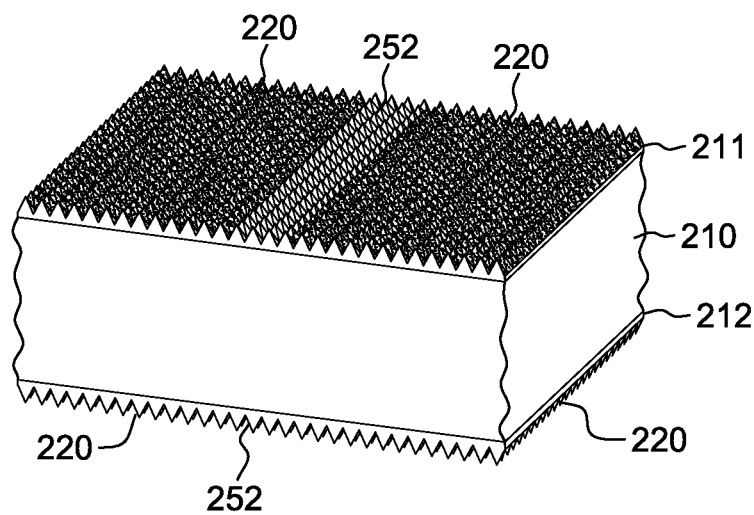
Figure 3C:
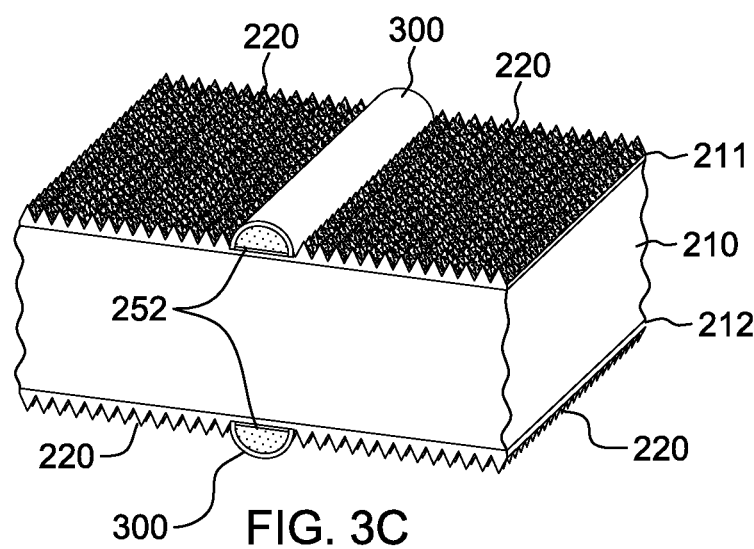

By way of further explanation, FIGS. 3A-3C depict an embodiment of a process for removing the first portion of the metal seed layer, wherein the metal seed layer is removed prior to a further process, such as electroplating, for example. FIG. 3A depicts the embodiment of solar cell structure 200 of FIG. 2E, with the first portion of metal seed layer (see FIG. 2E) removed leaving the second portion 252 of the metal seed layer over the exposed portions of the surfaces 211, 212 of the solar cell structure 200. In this embodiment, the first portion of the metal seed layer may be ablated without ablating the second portion 252 of the metal seed layer. Selective ablation may occur due to the differences between the thermal conductivity of the patterned resist layer 230 and the exposed portions of the solar cell surfaces 211, 212.

In one example, the ablation may be achieved by irradiating at least the first portions of the metal seed layer, and possibly the second portions 252 of the metal seed layer, with a laser adapted to heat the metal seed layer. This heating may be controlled by selecting or controlling one or more properties of the laser, such as wavelength, pulse frequency, power, etc. These laser properties may be chosen to provide a heat sufficient to ablate the first portion of the metal seed layer without ablating the second portion 252 of the metal seed layer. As the laser irradiates the first portion of the metal seed layer, the lower thermal conductivity of the resist layer 230 below the first portion of the metal seed layer inhibits heat dissipation from the first portion of the metal seed layer into the resist layer 230, thereby ablating the first portion of the metal seed layer formed over the resist layer 230. The ablation may occur by vaporization of the first portion, by modifying the properties of the first portion to cause the same to become brittle, or by mechanical destruction thereof.

In another example, the second portion 252 of the metal seed layer formed over exposed portion of the surfaces 211, 212 of the solar cell structure 200, may also be irradiated by the laser. In this case, the differences between the thermal conductivity of the surfaces 211, 212 of the solar cell structure 200 and the thermal conductivity of the resist layers 230. The difference in thermal conductivities facilitates heating of the second portion 252 of the metal seed layer. The thermal conductivity of the surfaces 211, 212 of the solar cell structure 200 provides a heat dissipation rate high enough to dissipate heat from the second portion 252 of the metal seed layer without allowing a temperature of the metal seed layer to exceed a threshold at which ablation occurs in that portion of the metal seed layer. Thus, while the first portion of the metal seed layer is ablated by the laser, the second portion 252 of the metal seed layer remains intact and is not ablated.

Note that the laser wavelength, pulse frequency, power, etc. may be modified and adjusted in various combination to provide a desired amount of heat that may ablate the first portion of the metal seed layer without ablating the second portion 252 thereof. With these properties, complete ablation of the first portion 252 of a nickel seed layer over a dry film resist 230 may be achieved, without ablating the second portion 252 of the nickel seed layer. Note also that other ablation techniques that selectively remove the first portion of the metal seed layer without removing the second portion 252 of the metal seed layer, such as via the use of mechanical abrasion tools, may achieve similar results to the use of the laser ablation techniques described above, and are contemplated as possible alternative approaches to the selective removal discussed herein.

FIG. 3B depicts the solar cell structure 200 of FIG. 3A, with the patterned resist layer removed, leaving the protected portions of anti-reflective coating layer 220 and the second portion 252 of the metal seed layer. In one example, the patterned resist layer may be removed by any means that selectively strips the resist layer from the solar cell structure 200 without affecting the second portion 252 of the metal seed layer or the anti-reflective coating layer 220. In one instance, this may be accomplished via exposure of the resist layer to an alkaline stripping solution selected to dissolve the patterned resist layer. This results in the structure 200 with a conductive metal seed layer pattern as shown. The solar cell structure 200 may then be subjected to further processing, as desired for a specific process flow.

For instance, FIG. 3C depicts the solar cell structure 200 of FIG. 3B, after electroplating the second portion 252 of the metal seed layer with a conductive material 300. The conductive properties of the second portion 252 of the metal seed layer facilitate the electroplating process, whereas the anti-reflective coating layer 220, being less electrically conductive, facilitates the process by resisting electroplating. The result may be, for example, a curvilinear, rounded, or "mushroom" shaped layer of electroplated conductive material 300 over the second portion 252 of the metal seed layer. The narrow width of the second portion 252 of the metal seed layer may act to confine the electroplated conductive material 300 to a similar width resulting in a desirable narrow width of metal electrodes for the solar cell structure 200. The second portion 252 of the metal seed layer may also further act to prevent penetration of the electroplated material 300 into the surfaces 211, 212 or the substrate 210 of the solar cell structure. For example, where the metal seed layer is a nickel seed layer, electroplating nickel, copper, and silver over the nickel may provide the desired level of electrical conductivity through the resultant electrodes, without damaging the surface 211, 212 or the substrate 210 of the solar cell structure 200. Electroplating of nickel over a nickel seed metal layer also acts to prevent diffusion of any electroplated copper or silver through the metal seed layer onto the surfaces 211, 212.

Figure 4A:
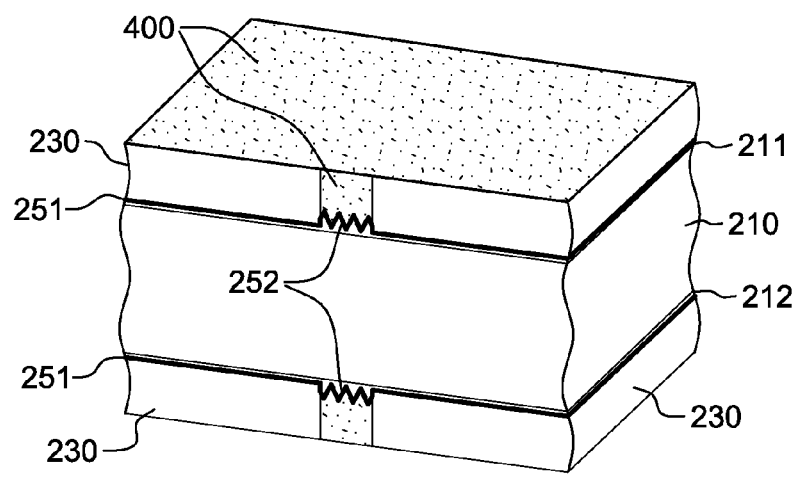
FIGS. 4A-4C depict another example of a process for the selective removal of the first portion of the metal seed layer and for forming metal electrodes, in which a conductive material is electroplated over the metal seed layer, the first portion of the metal seed layer and the conductive material over the metal seed layer are removed, and the patterned resist layer is removed, according to one or more aspects of the present invention.
Figure 4B:
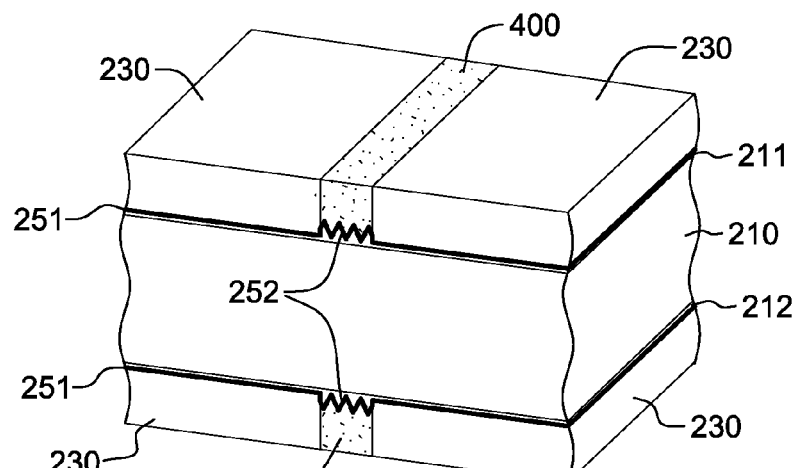
Figure 4C:
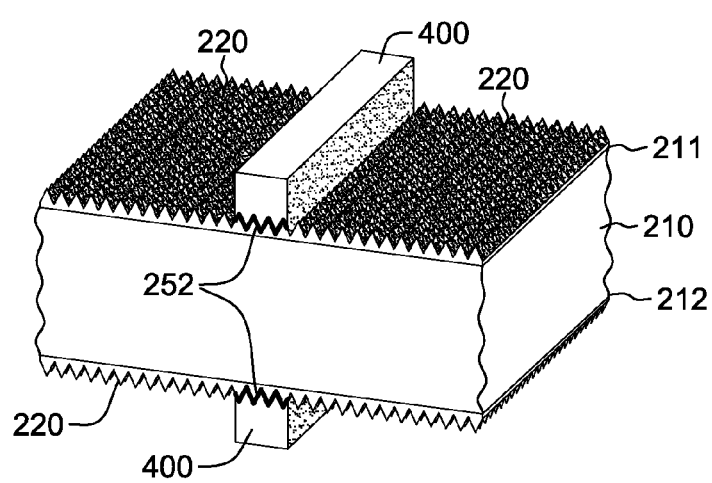

FIGS. 4A-4C depict another embodiment of a process for removing the first portion 251 of a metal seed layer, such as described herein, wherein a conductive material 400 is provided prior to removal of the first portion 251 of the metal seed layer 250. FIG. 4A depicts the solar cell structure 200 of FIG. 2E, with the first portion 251 of the metal seed layer and second portion 252 of the metal seed layer 250 covered by the conductive material 400. In one implementation, after deposition of the metal seed layer has occurred, the conductive material 400 may be provided over the metal seed layer, covering the first portion 251 of the metal seed layer and the second portion 252 of the metal seed layer. The conductive material 400 may, in one embodiment, be electroplated over the metal seed layer in a damascene-like process, resulting in conductive material 400 filling the channels over the second portions 252 of the metal seed layer. The resultant conductive material 400 may have a first portion over the first portion 251 of the metal seed layer, and a second portion over the second portion 252 of the metal seed layer. As described above, the second portion 252 of the metal seed layer may act, in part, to prevent the conductive material 400 from directly contacting solar cell structure 200.

FIG. 4B depicts the solar cell structure 200 of FIG. 4A, wherein the first portion of the metal seed layer and the conductive material over the first portion of the metal seed layer have been selectively removed, leaving behind the second portion 252 of the metal seed layer with the conductive material 400 disposed thereon. In one example, selective removal may be achieved by an ablative process, similar to the process described above in connection with FIG. 3A, in which the first portion of the metal seed layer and the first portion of the conductive material are ablated without ablating the second portion 252 of the metal seed layer or the conductive material 400 thereon.

In one example, ablation may be achieved by irradiating at least the conductive material 400 formed over the first portion of the seed metal layer with a laser. The portion of the conductive material 400 formed over the second portion 252 of the seed metal layer may also be irradiated by the laser. In one example, the laser irradiation process may be similar to the processing described above, wherein the conductive material formed over the first portion is ablated along with the first portion of the metal seed layer. In this example, the ablation threshold of the metal seed layer may be considered to be a first ablation threshold, with the conductive material 400 having a second ablation threshold. In one instance, the two thresholds may be similar, as for instance when the metal seed layer and the conductive material 400 are composed of similar materials. In another instance, the ablation thresholds may be different, for instance, when the metal seed layer is a first metal material, such as nickel, and the conductive material 400 is a second material, such as silver or gold. As the laser irradiates the conductive material 400 formed over the first portion of the metal seed layer, the heat of the laser builds in the first portion of the metal seed layer and in the conductive material 400 thereon. In one instance, the lower thermal conductivity of the resist layer 230 adjacent the first portion of the metal seed layer inhibits heat dissipation from the metal seed layer and the conductive material into the resist layer 230, which facilitate the heating thereof. Thus, the ablation threshold of the first portion of the metal seed layer and the ablation threshold of the first portion of the conductive material may be or more readily exceeded than the corresponding thresholds of the second portion 252 of the metal seed layer and the conductive material 400 disposed thereon.

FIG. 4C depicts the solar structure 200 of FIG. 4B, following removal of the patterned resist layer, leaving behind the protected portions of anti-reflective coating layer 220, the second portion 252 of the metal seed layer, and the conductive material 400 electroplated over the second portion 252 of the metal seed layer. In one example, as described previously, the patterned resist layer may be removed by a means that selectively strips the resist layer from the solar cell structure 200 without interacting with the remaining second portion 252 of the metal seed layer or anti-reflective coating layer 220. In one instance, this may be by exposure of the resist layer to an alkaline stripping solution designed to dissolve the patterned resist layer, which leaves behind metal electrodes with a block or rectilinear profile, as depicted, due to the electroplating having been performed before removal of the resist layer. Forming this kind of electrode shape may facilitate reducing "shadowing" over the anti-reflective coating surface of the solar cell structure 200, compared with the rounded or "mushroom" shaped electrode profiles described above. Similar to previously described embodiments, the remaining second portion 252 of the metal seed layer and the conductors 400 form grid "fingers", which may advantageously have a width of about 50 micrometers or less.

Figure 5A:
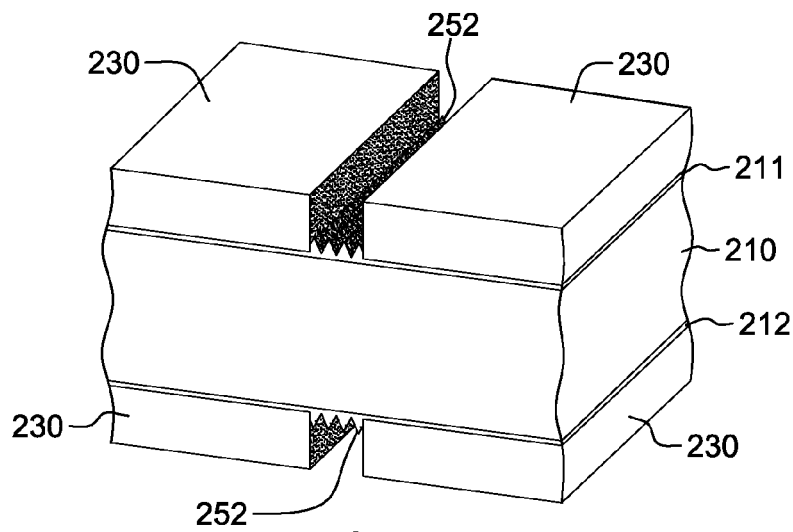
FIGS. 5A-5C depict yet another example of a process for the selective removal of the first portion of the metal seed layer and for forming metal electrodes, in which the first portion of the metal seed layer is removed, a conductive material is electroplated over the second portion of the metal seed layer, and the patterned resist layer is removed, according to one or more aspects of the present invention.
Figure 5B:
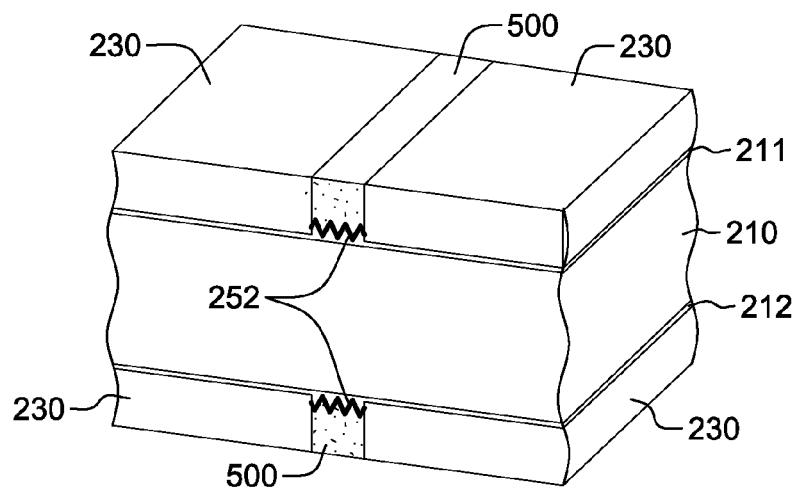
Figure 5C:
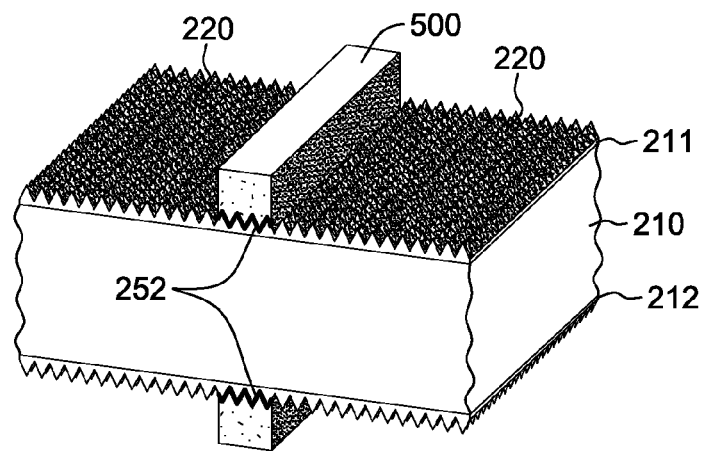

FIGS. 5A-5C depict another embodiment of a process for removing the first portion 251 of a metal seed layer, in which the metal seed layer is removed prior to a further electroplating process, wherein the electroplating process is accomplished prior to removal of the patterned resist layer 230. FIG. 5A depicts the solar cell structure 200 of FIG. 2E, with the first portion of the metal seed layer removed from the resist layer 230, leaving the second portion 252 of the metal seed layer over the exposed portion of the surface 211, 212 of the solar cell structure. In this embodiment, the first portion of the metal seed layer may be removed, for instance, by an ablative process, which may be similar to the process described above in connection with FIG. 3A, in which the difference in thermal conductivities between the patterned resist layer 230 and the surfaces 211, 212 of the solar cell structure 200 facilitates the ablation process.

FIG. 5B depicts the solar cell structure 200 of FIG. 5A, following electroplating of a conductive material 500 over the second portion 252 of the metal seed layer. In one example, the conductive properties of the second portion 252 of the metal seed layer facilitate the electroplating process, whereas the patterned resist layer 230, being less electrically conductive, resists electroplating. In one instance, with the patterned resist layer 230 in place, the resultant electrodes will again have a rectilinear profile, which may reduce any undesired "shadowing" over the surface of the solar cell structure 200. As previously described, the second portion 252 of the metal seed layer may further act to prevent penetration of the electroplated material 500 into the surfaces 211, 212 or substrate 210 of the solar cell structure 200.

FIG. 5C depicts the solar cell structure 200 of FIG. 5B, with the patterned resist layer removed, leaving behind the remaining anti-reflective coating layer 220, the second portion 252 of the metal seed layer with the conductive material 500 formed thereon. In one example, similar to previously described embodiments, the second portion 252 of the metal seed layer forms conductive grid "fingers" with a width of about 50 micrometers or less, over which the electrodes are formed.

Figure 6:
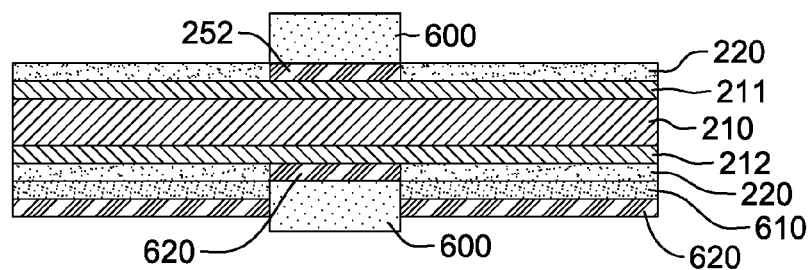
FIG. 6 depicts an alternative embodiment of a solar cell structure, in which the solar cell structure has a front surface and a back surface, and a reflective back surface structure is formed over the back surface, according to one or more aspects of the present invention.

FIG. 6 depicts another embodiment of solar cell structure 200, wherein the solar cell structure 200 has a front surface 211 and a back surface 212. In one example, the front surface 211 is processed according to one or more of the methods described above to form a conductive pattern thereon, while the back surface 212 is processed to form a reflective back surface structure. In one instance, the back surface 212 may be subjected to one or several of the same processes as the front surface 211. For example, a back patterned resist layer 610 and a back metal seed layer 620 may be provided. In one example, the reflective back surface structure is formed by leaving in place both the back metal seed layer 620 and the back patterned resist layer 610, while the corresponding layers over the front surface are removed, in accordance with one or more of the above described methods. The combination of the back metal seed layer 620 and the back patterned resist layer 610 forms one embodiment of a reflective back surface structure. In one example, the reflective back surface structure may be further enhanced if the back patterned resist layer 610 is, for instance, a polymer film layer with an appropriate refractive index, ranging between about 1.5 to about 1.9. By way of example, a photo-sensitive polymer, such as an acrylic or epoxy, may provide the appropriate refractive index, and may also be a suitable material to form the patterned resist layer 610 over the front surface 211.

In another example, the back resist layer 610 may be further processed to form a pattern therein, similar to the patterned resist layer formed over the front surface 211. This may permit back metal seed layer 620 to remain with the back patterned resist layer 610 to facilitate forming the reflective back surface structure, while also facilitating providing electrical continuity between the back metal seed layer 620 and the exposed portion of the back surface 212 of the solar cell structure 200. The reflective back surface structure may then have electrical contact with the back surface 212 of the solar cell structure 200, as may be required for a back-mirrored structure for several types of solar cell structures. The back metal seed layer 620 contacting the back surface 212 may further have a conductive material 600 electroplated thereon, similar to a conductive material electroplated over the front surface 211. Thus, the methods described above for forming a conductive pattern over the front surface 211 of a solar cell structure 200 may similarly be used, in part, to also form a reflective back surface structure over the back surface 212 of the solar cell structure 200. This may further improve manufacturing efficiency and completion of high-efficiency solar cells.

Figure 7A:
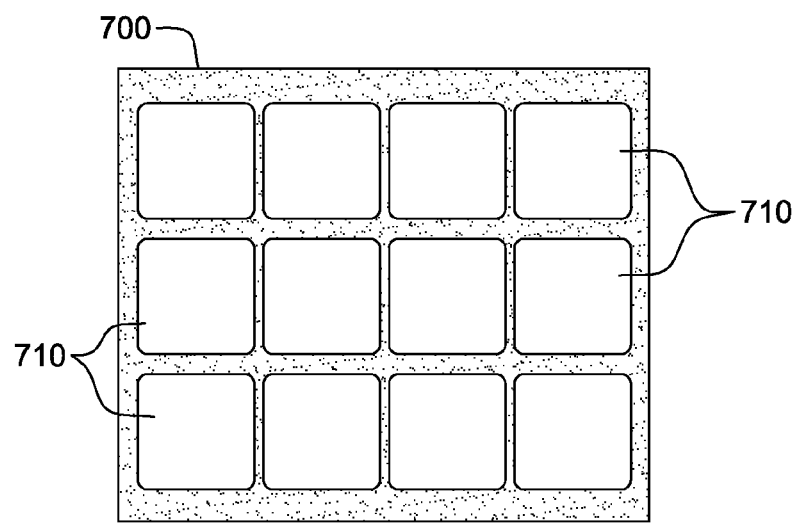
FIG. 7A depicts an embodiment of a frame structure with a plurality of openings, according to one or more aspects of the present invention.
Figure 7B:
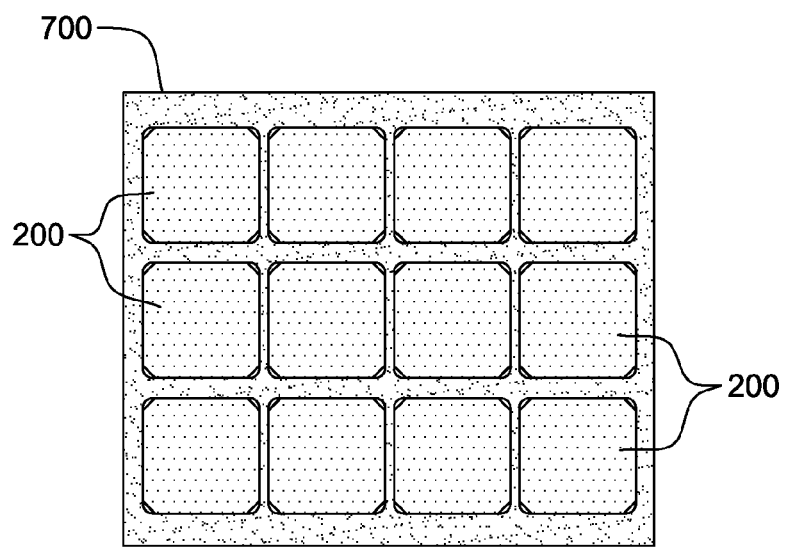
FIG. 7B depicts the frame structure of FIG. 7A with a plurality of solar cell structures disposed within the openings of the frame structure, according to one or more aspects of the present invention.

FIG. 7A depicts an embodiment of a frame structure 700 with a plurality of openings 710, each of the openings being designed to accommodate a solar cell structure 200 therein. FIG. 7B further depicts the embodiment of frame structure 700 with a plurality of solar cell structures 200 disposed within the plurality of openings. It is to be understood that any one or more of the plurality of solar cell structures 200 may be a solar cell structure 200 as described in one or more of the previous embodiments. The methods as described above enable fabrication of conductive patterns over any number of solar cell structures 200 during the same manufacturing process. Frame structure 700 facilitates processing of multiple solar cell structures 200 by facilitating holding a plurality of solar cell structures 200 in place, so that any one or more of the methods described above may be applied simultaneously to the plurality of solar cell structures 200. Greater manufacturing efficiency may be achieved if, for example, the plurality of solar cell structures 200 is processed via the same method, so that a single manufacturing process facilitates fabrication of conductive patterns over the plurality of solar cell structures 200. However, alternative process flows may allow for processing of one or a portion of the plurality of solar cell structures 200 disposed within the frame structure 700 according to one or more of the methods described above, with some other portion of the plurality of solar cell structures 200 processed separately, according to one or more of the methods described above or by other methods, and it is to be understood that such alternative process flows are contemplated as being within the scope of the present invention.

Frame structure 700 may also provide other advantages in the processing of solar cell structures 200, depending on the type of frame structure 700 used.

In one example, the frame structure 700 may be formed from a non-conducting material, such as a plastic, that provides stability to the plurality of solar cell structures 200 as one or more of the plurality of solar cell structures 200 is processed according to one or more methods as previously described.

In another example, the frame structure 700 may be formed from a conductive material, such as a metal, that facilitates providing electrical continuity between the frame structure 700 and the plurality of solar cell structures 200. In one instance, the electrical continuity may further facilitate electroplating of a conductive material over a portion of one or more of the solar cell structures 200.

In yet another example, the frame structure 700 may be a printed circuit board or flex structure, the frame structure 700 facilitating fabrication of a solar cell structure 200 by facilitating connections between the plurality of solar cell structures 200 disposed within the openings 710 of the frame structure 700. In one instance, the patterned resist layer may remain in place, rather than being removed, on one or both sides of the frame structure 700. This may, for example, facilitate holding the plurality of solar cell structures 700 in place within the openings 710 of the frame structure 700.

Figure 7C:
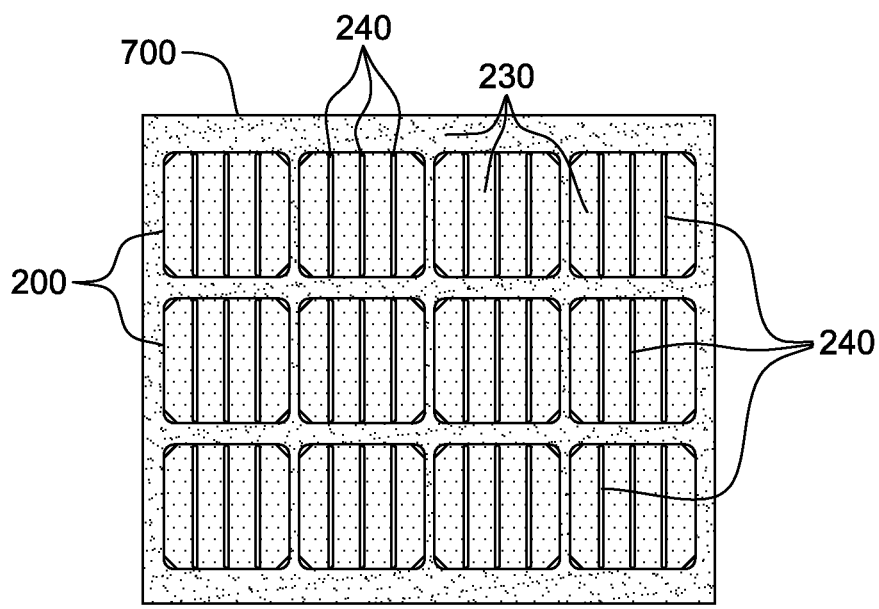
FIG. 7C depicts the frame structure of FIG. 7B after application of patterned resist layers and an etching of a portion of anti-reflective layers formed over each of the plurality of solar cell structures and the frame structure, according to one or more aspects of the present invention.

FIG. 7C depicts the frame structure 700 of FIG. 7B, with a plurality of solar cell structures 200 disposed within the openings of the frame structure 700, wherein a patterned resist layer 230 has been provided over not only one solar cell structure 200, as previously described, but over the plurality of solar cell structures 200 and the frame structure 700. FIG. 7C further depicts an embodiment of the patterned resist layer 230 as it may appear after a pattern has already been formed in the resist layer 230 and the plurality of solar cell structures 200, and after a portion of an anti-reflective coating over the plurality of solar cell structures 200 has been etched away, leaving an exposed portion 240 of the surfaces of the plurality of solar cell structures 200. In one or more examples, the patterned resist layer 230 may further facilitate holding the plurality of solar cell structures 200 within the openings of frame structure 700. For example, a dry film resist layer, such as a photo-sensitive polymer as previously described, may act to hold the solar structures 200 in place within the frame structure 700.

Figure 7D:
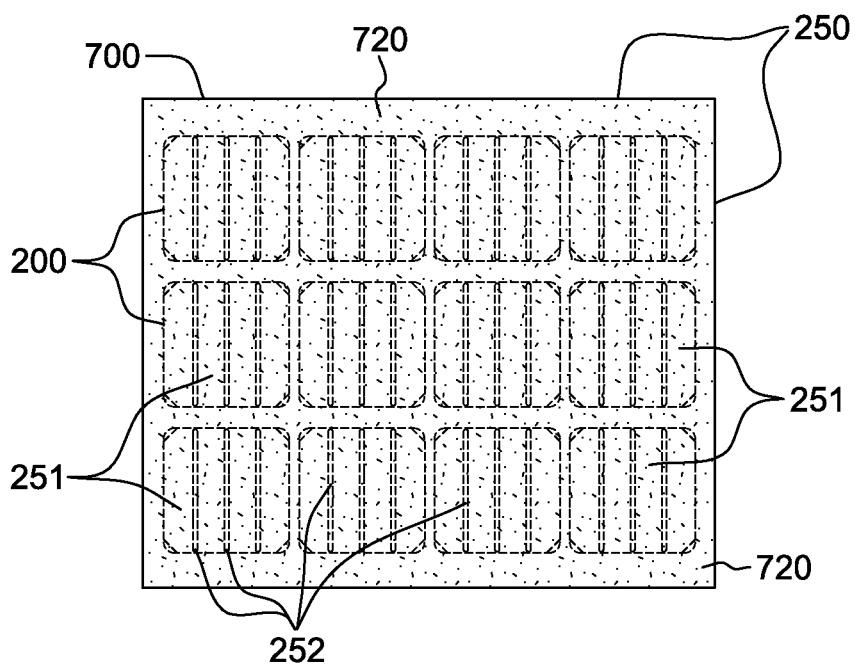
FIG. 7D depicts the frame structure of FIGS. 7B and 7C after an application of a metal seed layer, according to one or more aspects of the present invention.

FIG. 7D shows the frame structure 700 and the plurality of solar cell structures 200 of FIG. 7C, with a metal seed layer 250 provided over the patterned resist layer (not visible in this figure). In one example, the metal seed layer 250 not only has a first portion 251 over the patterned resist layer and a second portion 252 over the exposed portions of the surface of the plurality of solar cell structures 200, but also has a third portion 720 that extends over and contacts the frame structure 700. The process used to remove the first portion 251 of the metal seed layer 250, without removing the second portion 252 of the metal seed layer 250, may also be used to remove the third portion 720 of the metal seed layer 250. For example, as similarly described above in conjunction with FIG. 3A, the first and third portions 251, 720 of the metal seed layer 250 may be removed by ablating the first and third portions 251, 720 of the metal seed layer 250, without ablating the second portion 252 of the metal seed layer 250. As described previously, the differences between the thermal conductivity of the patterned resist layer and the thermal conductivity of the surfaces of the solar cell structure 200 facilitates the ablation process. In one instance, as similarly described in connection with FIG. 3A, ablation may be accomplished by laser irradiation to heat the first and third portions 251, 720 of the metal seed layer 250 past the ablation threshold of the metal seed layer 250, wherein the thermal conductivity inhibits thermal spreading, thereby facilitating the heating. In another instance, while the second portion 252 of the metal seed layer 250 remains in place, wherein the second thermal conductivity facilitates dissipating any heating by the laser of the second portion 252 of the metal seed layer 250 by sinking the heat into the underlying solar cell structure 200.

Figure 8A:
FIGS. 8A-8C depict a method of processing a frame structure with a plurality of solar cell structures, in which a conductive material is electroplated prior to removal of the metal seed layer and patterned resist layer, according to one or more aspects of the present invention.

FIG. 8A depicts an alternative embodiment of the frame structure of FIG. 7D, in which a conductive material 400 is electroplated over the metal seed layer, prior to the removal of the first portion of the metal seed layer. In one example, the conductive material 400 is electroplated over the frame structure 700 and the plurality of solar cell structures, in a process that may be similar to a process for one solar cell structure as previously described in conjunction with FIG. 4A.

Figure 8B:
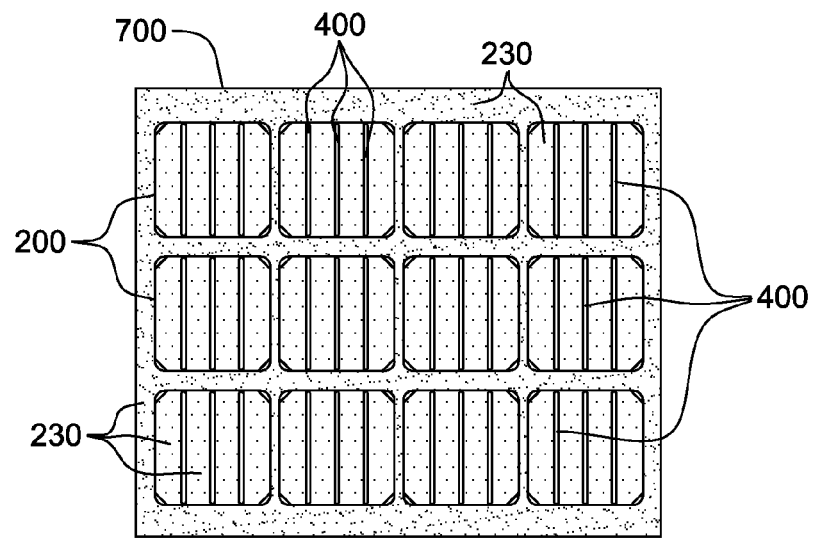

FIG. 8B depicts the frame structure 700 of FIG. 8A, following selective removal of the first portion of the metal seed layer, the third portion of the metal seed layer, and the conductive material 400 over those portions, without removing the second portion 252 of the metal seed layer (not visible in this figure) or the conductive material 400 over the second portion 252 of the metal seed layer 250. In one example, selective removal of the conductive material 400 and first and third portions of the metal seed layer may be accomplished by ablating the first and third portions of the metal seed layer, and the conductive material over those portions, without ablating the second portion 252 of the metal seed layer or the conductive material 400 over it, in a process that may be similar to a process for one solar cell structure as previously described in conjunction with FIG. 4B.

Figure 8C:
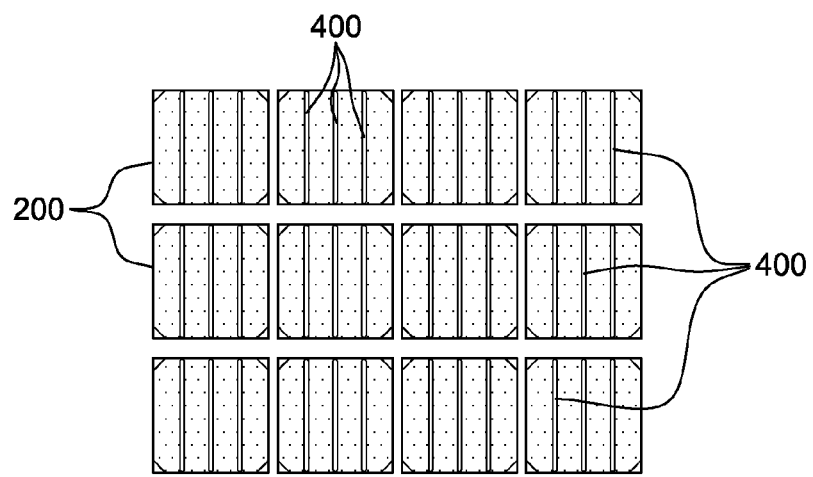

FIG. 8C depicts an embodiment of the plurality of solar cell structures 200 of FIG. 8B, with the electroplated conductive material 400 over the remaining portion of the metal seed layer (not visible in this figure), following removal of the patterned resist layer. In one example, removal of the patterned resist layer facilitates separation of the plurality of solar cell structures 200 from the frame structure. In one example, as similarly described previously, the patterned resist layer may be removed by a means that selectively strips the material forming the resist layer from the solar cell structure 200 without interacting with the remaining layers over the solar cell structure 200, such as by exposure of the resist layer to an alkaline stripping solution. The resulting plurality of solar cell structures 200 may then be ready for use or for further processing.

Figure 9A:
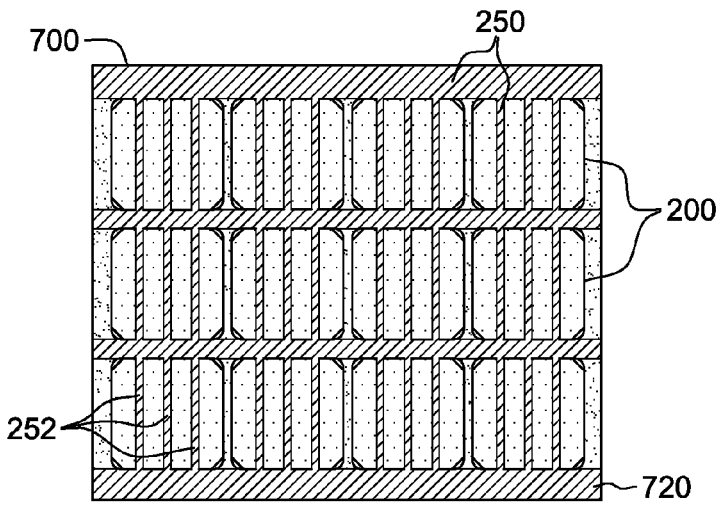
FIGS. 9A-9C depict another example of a method of processing a frame structure and a plurality of solar cell structures, in which a first portion of the metal seed layer is removed and a second portion over the exposed surface of the plurality of solar cell structures is left intact, along with a third portion over the frame structure, followed by electroplating over the remaining metal seed layer and removing the patterned resist layer, according to one or more aspects of the present invention.

FIG. 9A depicts another alternative embodiment of the frame structure of FIG. 7D, with a portion of the metal seed layer intact over the frame structure 700 and the plurality of solar cell structures 200, in which the first portion of the metal seed layer is removed without removing the second portion 252 or third portion 720 of the metal seed layer. In one example, allowing the second portion 252 of the metal seed layer and the third portion 720 of the metal seed layer to remain in place may facilitate electrical continuity between the frame structure 700 and the plurality of solar cell structures 200. In one instance, this electrical continuity may be used to facilitate electroplating of a conductive material over the second portion 252 of the metal seed layer over the plurality of solar cell structures 200. Selective removal of the first portion of the metal seed layer may, in one example, be accomplished by a method as described previously in conjunction with FIG. 5A, wherein the third portion 720 of the metal seed layer is not subjected to the selective removal process. In one instance, the first portion of the metal seed layer and the second portion 252 of the metal seed layer may be selectively irradiated with a laser, as described in one or more previous embodiments, without irradiating the third portion 720 of the metal seed layer. The third portion 720 of the metal seed layer over the frame structure 700 is generally not irradiated, as a portion of the patterned resist layer may be below the third portion 720 of the metal seed layer, and irradiating this third portion 720 may then result in undesired evaporation, ablation, and/or removal of the third portion 720 of the metal seed layer.

Figure 9B:
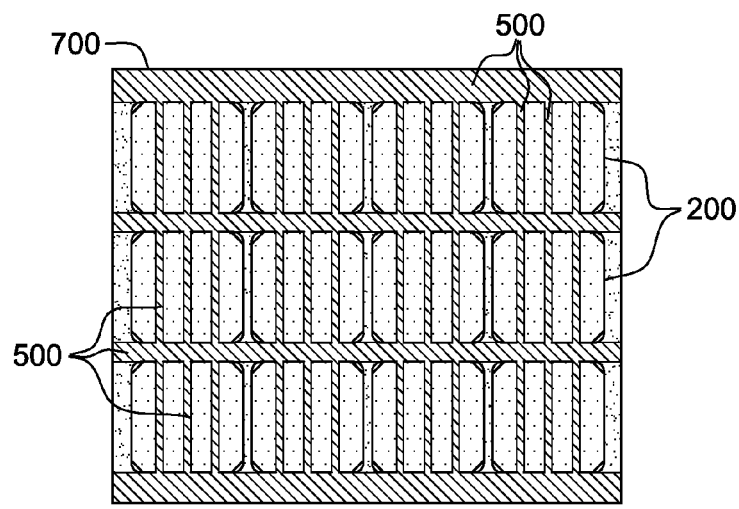

FIG. 9B depicts the frame structure 700 and plurality of solar cell structures 200 of FIG. 9A, following selective removal of the first portion of the metal seed layer, exposing a portion of the patterned resist layer. In one example, a conductive material 500 may be electroplated over the second portion and third portion of the metal seed layer. In one instance, the electroplating may be facilitated by the third portion of the metal seed layer remaining over the frame structure 700. The third portion of the metal seed layer, which may remain in contact with the second portion of the metal seed layer, may allow for electrical continuity between the frame structure 700 and solar cells 200 to facilitate the electroplating process.

Figure 9C:
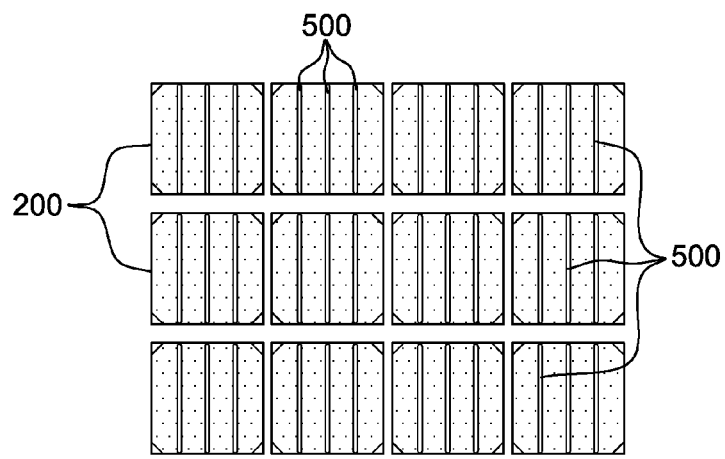

FIG. 9C depicts the plurality of solar cell structures 200 of FIG. 9B, with an electroplated conductive material 500 over the remaining portion of the metal seed layer (not visible in this figure), following removal of the patterned resist layer and separation of the plurality of solar cell structures 200 from the frame structure. In one example, as similarly described previously, the patterned resist layer may be removed by a means that selectively strips the resist layer from the solar cell structure 200 without interacting with the remaining layers over the solar cell structure 200, such as by exposure of the resist layer to an alkaline stripping solution designed to dissolve the resist layer. The resulting plurality of solar cell structures 200 may then be ready for use or for further processing.

Figure 10:
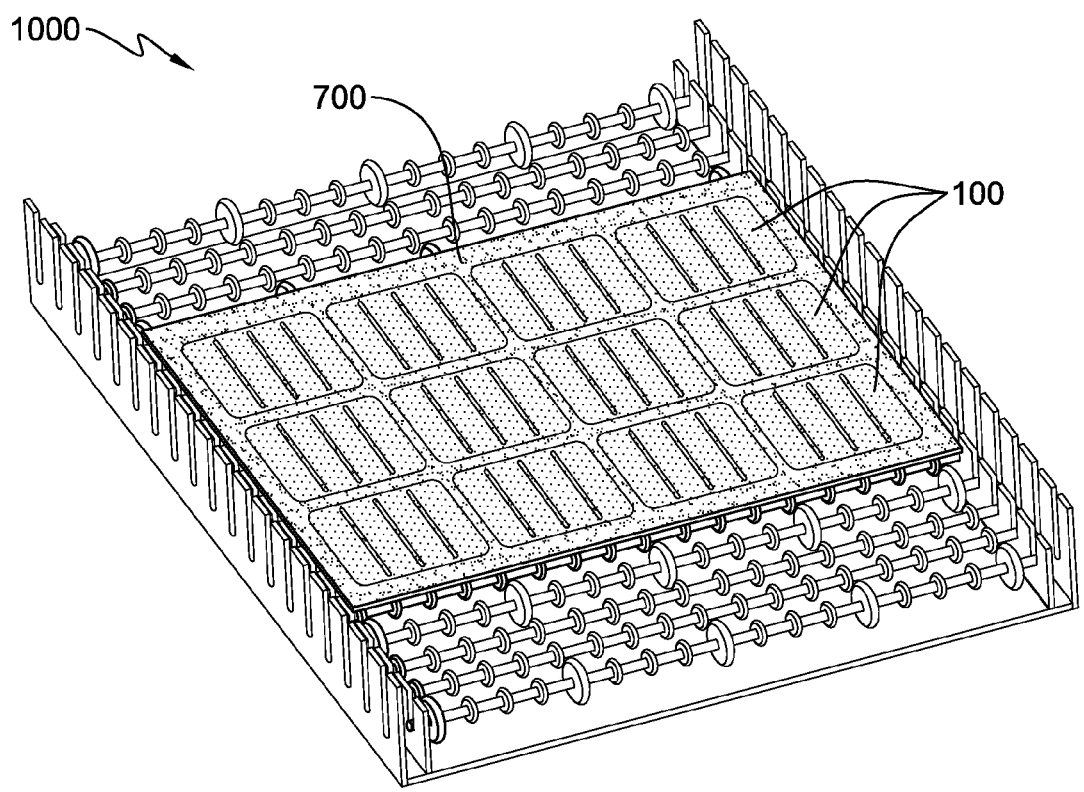
FIG. 10 depicts one example of an apparatus for facilitating separation of a plurality of solar cell structures from a frame structure, according to one or more aspects of the present invention.

FIG. 10 depicts one embodiment of an apparatus 1000 that may be used to facilitate separation of a frame structure 700 from a plurality of solar cell structures 200. The apparatus 1000 depicted permits the frame structure 700 to rest on a series of larger rollers, with a series of smaller rollers beneath or between the larger rollers. In one example, the apparatus 1000 may be enclosed on all sides, and the apparatus 1000 filled with a stripper solution designed to dissolve the patterned resist layer, as described in previous embodiments. This may be, for example, an alkaline solution designed to dissolve a dry film resist. The solution dissolves the patterned resist layer. In one example, as the resist layer dissolves, the rollers may facilitate the separation process as well. The plurality of solar cell structures 200 may separate from the frame structure 700 and drop onto the smaller rollers, while the frame structure 700 remains on the larger rollers. The frame structure 700 and stripper solution may then be removed, leaving behind the separated plurality of solar cell structures 200.

Advantageously, in one aspect, disclosed herein are various processes for selectively removing a first portion of a metal seed layer, or a first portion of a metal seed layer and an overlying conductive layer, without affecting an underlying layer, such as a patterned resist layer. Specifically, laser ablation may be employed to completely and entirely remove the first portion of the metal seed layer, without removing or damaging the underlying layer below the first portion of the metal seed layer, for instance, the patterned photoresist layer. Advantageously, the approaches described herein eliminate the need for any reliance on conventional seed metal lift-off processing. Additionally, the selective removal processes disclosed allow for directed laser patterning of the seed metal over the "panel" of wafers held together in the frame structure (or template) in such a way as to allow the seed metal to remain in place where desired. By selectively allowing the seed metal to remain in place where desired, the seed metal can be patterned off of the panel of wafers within the template in such a way that an "electroplating power bus" can be left in place, interconnecting the solar cells held together as a panel in the frame structure. The interconnection between solar cells can be used to allow electroplating to occur only in the areas where the seed metal was left in place over the "panel", such that a majority of electroplating current is directed to the electrode grid on the solar cells, and not the otherwise fully metalized surface of the panel (as depicted in FIGS. 9A & 9B).

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
   providing a solar cell structure having an anti-reflective coating layer thereon;
   forming a patterned resist layer over the anti-reflective coating layer of the solar cell structure;
   etching away an exposed portion of the anti-reflective coating layer using the patterned resist layer, the etching exposing a portion of the solar cell structure;

forming a metal seed layer over the patterned resist layer and the exposed portion of the solar cell structure, the metal seed layer comprising a first portion over the patterned resist layer and a second portion over the exposed portion of the solar cell structure;

selectively removing the first portion of the metal seed layer, and the patterned resist layer, leaving the second portion of the metal seed layer; and wherein the patterned resist layer has a first thermal conductivity and a surface of the solar cell structure within the exposed portion thereof has a second thermal conductivity higher than the first thermal conductivity of the patterned resist layer, and wherein the selectively removing the first portion of the metal seed layer comprises ablating the first portion of the metal seed layer without ablating the second portion of the metal seed layer, the ablating being facilitated by the first thermal conductivity of the patterned resist layer being lower than the second thermal conductivity of the surface of the solar cell structure.

2. The method of claim 1, wherein the metal seed layer has an ablation threshold, and wherein the ablating comprises irradiating at least the first portion of the metal seed layer with a laser, the laser heating at least the first portion of the metal seed layer so that the ablation threshold is exceeded in the first portion of the metal seed layer, wherein the first thermal conductivity of the patterned resist layer facilitates the heating of the first portion of the metal seed layer.

3. The method of claim 2, wherein the ablating further comprises also irradiating the second portion of the metal seed layer with the laser, the laser heating the second portion of the metal seed layer, wherein the second thermal conductivity of the surface of the solar cell structure facilitates dissipating heating of the second portion of the metal seed layer so as to remain below the ablation threshold of the metal seed layer in the second portion of the metal seed layer.

4. The method of claim 1, further comprising electroplating a conductive material over the metal seed layer, the conductive material having a first portion over the first portion of the metal seed layer and a second portion over the second portion of the metal seed layer, and wherein selectively removing the first portion of the metal seed layer without removing the second portion of the metal seed layer further comprises also removing the first portion of the conductive material without removing the second portion of the conductive material.

5. The method of claim 4, wherein selectively removing the first portion of the conductive material and the first portion of the metal seed layer comprises ablating the first portion of the conductive material and the first portion of the metal seed layer without ablating the second portion of the conductive material or the second portion of the metal seed layer, the ablating being facilitated by the first thermal conductivity of the patterned resist layer being lower than the second thermal conductivity of the surface of the solar cell structure.

6. A method comprising:
providing a solar cell structure having an anti-reflective coating layer thereon;
forming a patterned resist layer over the anti-reflective coating layer of the solar cell structure;
etching away an exposed portion of the anti-reflective coating layer using the patterned resist layer, the etching exposing a portion of the solar cell structure;
forming a metal seed layer over the patterned resist layer and the exposed portion of the solar cell structure, the metal seed layer comprising a first portion over the patterned resist layer and a second portion over the exposed portion of the solar cell structure;
selectively removing the first portion of the metal seed layer, and the patterned resist layer, leaving the second portion of the metal seed layer; and
wherein the anti-reflective coating and patterned resist layer and metal seed layer are provided over a front surface of the solar cell structure and the solar cell structure further comprises a back surface, and the method further comprises:
providing a back patterned resist layer over a back anti-reflective coating layer overlying the back surface of the solar cell structure;
providing a back metal seed layer over the back patterned resist layer; and
leaving the back metal seed layer and back patterned resist layer intact to facilitate forming a reflective back surface structure.

7. The method of claim 6, further comprising using the back patterned resist layer in etching an exposed portion of the back anti-reflective coating layer to expose a portion of the back surface of the solar cell structure, and wherein providing the back metal seed layer over the back patterned resist layer further comprises providing the back metal seed layer over the exposed portion of the back surface of the solar cell structure to facilitate providing electrical continuity between the reflective back surface structure and the back surface of the solar cell structure.

8. A method comprising:
providing a solar cell structure having an anti-reflective coating layer thereon;
forming a patterned resist layer over the anti-reflective coating layer of the solar cell structure;
etching away an exposed portion of the anti-reflective coating layer using the patterned resist layer, the etching exposing a portion of the solar cell structure;
forming a metal seed layer over the patterned resist layer and the exposed portion of the solar cell structure, the metal seed layer comprising a first portion over the patterned resist layer and a second portion over the exposed portion of the solar cell structure;
selectively removing the first portion of the metal seed layer, and the patterned resist layer, leaving the second portion of the metal seed layer; and
providing a frame structure, the frame structure having a plurality of openings to accommodate a plurality of solar cell structures, and the solar cell structure being one solar cell structure of the plurality of solar cell structures, the one solar cell structure being disposed within one opening of the plurality of openings.

9. The method of claim 8, wherein providing the patterned resist layer further comprises providing the patterned resist layer over the frame structure and the plurality of solar cell structures, the patterned resist layer facilitating securing the plurality of solar cell structures and the one solar cell structure to the frame structure.

10. The method of claim 9, wherein the patterned resist layer comprises a dissolvable material, and wherein removing the patterned resist layer comprises exposing the patterned resist layer to a liquid selected to dissolve the patterned resist layer, the dissolving facilitating separation of the plurality of solar cell structures from the frame structure.

11. The method of claim 9, wherein providing the metal seed layer further comprises providing a third portion of the metal seed layer over the frame structure, wherein the third portion of the metal seed layer and the second portion of the metal seed layer facilitate providing electrical continuity between the frame structure and the plurality of solar cell structures.

12. The method of claim 11, wherein the selectively removing the first portion of the metal seed layer further comprises ablating the first portion of the metal seed layer without ablating the second portion and the third portion of the metal seed layer, the ablating being facilitated by a first thermal conductivity of the patterned resist layer being lower than a second thermal conductivity of a surface of the one solar cell structure within the exposed portion thereof.

13. The method of claim 12, wherein the metal seed layer has an ablation threshold, and wherein the ablating comprises selectively irradiating with a laser at least the first portion of the metal seed layer, without irradiating the third portion of the metal seed layer, the laser heating at least the first portion of the metal seed layer so that the ablation threshold is exceeded in the first portion of the metal seed layer, wherein the first thermal conductivity of the patterned resist layer facilitates heating of the first portion of the metal seed layer.

14. The method of claim 13, wherein the ablating further comprises also irradiating the second portion of the metal seed layer with the laser, the laser heating the second portion of the metal seed layer, wherein the second thermal conductivity of the surface of the solar cell structure facilitates dissipating heating of the second portion of the metal seed layer so that the ablation threshold of the metal seed layer is not exceeded in the second portion of the metal seed layer.

15. The method of claim 12, wherein the electrical continuity between the second and third portions of the metal seed layer further facilitates electroplating a conductive material over at least the second portion of the metal seed layer.

16. The method of claim 11, wherein the selectively removing the first portion of the metal seed layer further comprises ablating the first portion and third portion of the metal seed layer, without ablating the second portion of the metal seed layer, the ablating being facilitated by the first thermal conductivity of the patterned resist layer being lower than the second thermal conductivity of the surface of the one solar cell structure.

17. The method of claim 16, further comprising electroplating a conductive material over the metal seed layer, the conductive material having a first portion over the first portion of the metal seed layer and a second portion over the second portion of the metal seed layer and a third portion over the third portion of the metal seed layer, and wherein the ablating further comprises ablating the first portion of the conductive material and the third portion of the conductive material without ablating the second portion of the conductive material.

18. The method of claim 17, wherein the metal seed layer has a first ablation threshold and the conductive material has a second ablation threshold, and wherein the ablating further comprises irradiating at least the first portion of the conductive material and the third portion of the conductive material with a laser, the laser heating at least the first portion of the metal seed layer so that the first ablation threshold is exceeded in the first portion of the metal seed layer and heating the first portion of the conductive material so that the second ablation threshold is exceeded in the first portion of the conductive material, wherein the first thermal conductivity of the patterned resist layer facilitates the heating of the first portion of the metal seed layer and the first portion of the conductive material.

19. The method of claim 18, wherein the ablating further comprises also irradiating at least the second portion of the conductive material with the laser, the laser heating the second portion of the metal seed layer and the second portion of the conductive material, wherein the second thermal conductivity of the surface of the solar cell structure facilitates dissipating heating of the second portion of the metal seed layer so as to remain below the first ablation threshold in the second portion of the metal seed layer, and facilitates dissipating heating of the second portion of the conductive material so as to remain below the second ablation threshold in the second portion of the conductive material.

20. The method of claim 8, wherein the frame structure comprises an electrically conductive material facilitating providing electrical continuity between the frame structure and the plurality of solar cell structures.

21. The method of claim 8, wherein the frame structure comprises a printed circuit board or flex circuit structure, and wherein the frame structure facilitates fabrication of a solar module by facilitating providing electrical connections among the plurality of solar cell structures.

* * * * *